(12) United States Patent
Gianesello et al.

(10) Patent No.: US 10,447,230 B2
(45) Date of Patent: Oct. 15, 2019

(54) TRANSFORMER OF THE BALANCED-UNBALANCED TYPE

(71) Applicants: STMicroelectronics (Crolles 2) SAS, Crolles (FR); STMicroelectronics S.A., Montrouge (FR)

(72) Inventors: Frédéric Gianesello, Saint Alban Leysse (FR); Romain Pilard, Grenoble (FR); Cédric Durand, La Terrasse (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 15/653,014

(22) Filed: Jul. 18, 2017

(65) Prior Publication Data
US 2017/0317658 A1    Nov. 2, 2017

Related U.S. Application Data

(60) Continuation of application No. 14/981,189, filed on Dec. 28, 2015, now Pat. No. 9,755,610, which is a
(Continued)

(30) Foreign Application Priority Data

Jul. 28, 2011 (FR) ..................... 11 56881
Jun. 15, 2012 (FR) ..................... 12 55603

(51) Int. Cl.
*H01F 27/28* (2006.01)
*H03H 7/42* (2006.01)
*H01F 27/38* (2006.01)
*H01L 23/522* (2006.01)
*H01F 27/29* (2006.01)
(Continued)

(52) U.S. Cl.
CPC ........... *H03H 7/42* (2013.01); *H01F 27/2804* (2013.01); *H01F 27/29* (2013.01); *H01F 27/38* (2013.01); *H01F 27/40* (2013.01); *H01L 23/5227* (2013.01); *H04W 88/02* (2013.01);
(Continued)

(58) Field of Classification Search
CPC ....... H03H 7/42; H01F 27/40; H01F 27/2804; H01F 27/29; H01F 27/38; H01F 5/003; H01F 17/0006; H01F 19/00; H01F 19/02; H01F 19/04; H01F 19/06; H04W 88/02; H01L 23/5227; H01L 23/5223; H01L 2924/0002; Y10T 29/4902
USPC ....... 336/200, 232, 170, 147, 150, 105, 222; 455/77; 29/605
See application file for complete search history.

(56) References Cited

U.S. PATENT DOCUMENTS 2,151,757 A * 3/1939 George ............... H03D 7/1416
                                                    455/320
4,816,784 A    3/1989 Rabjohn
(Continued)

FOREIGN PATENT DOCUMENTS

EP    0836203 A2    4/1998
WO    2006002347 A1    5/2006
WO    2011047000 A1    4/2011

*Primary Examiner* — Mang Tin Bik Lian
(74) *Attorney, Agent, or Firm* — Slater Matsil, LLP

(57) ABSTRACT

A transformer of the balanced-unbalanced type includes a primary inductive circuit and a secondary inductive circuit housed inside an additional inductive winding connected in parallel to the terminals of the secondary circuit and inductively coupled with the primary circuit and the secondary circuit.

21 Claims, 4 Drawing Sheets

Related U.S. Application Data division of application No. 13/557,593, filed on Jul. 25, 2012, now Pat. No. 9,571,060.

(51) Int. Cl.
  *H01F 27/40*  (2006.01)
  *H04W 88/02*  (2009.01)

(52) U.S. Cl.
  CPC .. *H01L 23/5223* (2013.01); *H01L 2924/0002* (2013.01); *Y10T 29/4902* (2015.01)

(56) References Cited

U.S. PATENT DOCUMENTS

| | | | |
|---|---|---|---|
| 5,508,673 | A | 4/1996 | Staszewski |
| 5,742,213 | A | 4/1998 | Reynolds |
| 6,876,155 | B2 * | 4/2005 | Howald ................ H01J 37/321 |
| | | | 118/723 I |
| 7,626,472 | B2 | 12/2009 | Davies-Venn et al. |
| 7,629,860 | B2 | 12/2009 | Liu et al. |
| 7,777,589 | B2 | 8/2010 | Lee et al. |
| 8,049,589 | B2 | 11/2011 | Chen |
| 8,368,481 | B2 | 2/2013 | Jin et al. |
| 2003/0001709 | A1 | 1/2003 | Visser |
| 2004/0253939 | A1 | 12/2004 | Castaneda et al. |
| 2007/0296537 | A1 | 12/2007 | Yoon et al. |
| 2008/0139131 | A1 * | 6/2008 | Macphail ................. H03F 1/02 |
| | | | 455/90.2 |
| 2009/0207538 | A1 * | 8/2009 | Crawley ................. H04L 12/10 |
| | | | 361/56 |
| 2009/0262041 | A1 * | 10/2009 | Ikemoto ........... G06K 19/07749 |
| | | | 343/860 |
| 2009/0284339 | A1 | 11/2009 | Choi et al. |
| 2010/0033290 | A1 * | 2/2010 | Liu ..................... H01F 17/0013 |
| | | | 336/200 |
| 2010/0148866 | A1 | 6/2010 | Lee et al. |
| 2011/0128084 | A1 | 6/2011 | Jin et al. |
| 2011/0163824 | A1 * | 7/2011 | Kawano ................... H01F 21/02 |
| | | | 333/17.3 |
| 2011/0241163 | A1 * | 10/2011 | Liu ..................... H01L 23/5223 |
| | | | 257/531 |
| 2012/0020419 | A1 * | 1/2012 | Kaeriyama ......... H04L 25/4902 |
| | | | 375/259 |
| 2012/0119845 | A1 * | 5/2012 | Lu ............................ H01F 21/12 |
| | | | 333/26 |
| 2012/0326826 | A1 * | 12/2012 | Gertenbach ........... H01F 27/346 |
| | | | 336/171 |
| 2013/0265132 | A1 | 10/2013 | Huang et al. |

\* cited by examiner cross-section view cross-section view cross-section view

TRANSFORMER OF THE BALANCED-UNBALANCED TYPE

CROSS-REFERENCE TO RELATED APPLICATIONS

This application is a continuation of U.S. application Ser. No. 14/981,189, filed on Dec. 28, 2015, which is a divisional of U.S. application Ser. No. 13/557,593, filed on Jul. 25, 2012, which claims priority to French Application No. 1255603, filed Jun. 15, 2012, and to French Application No. 1156881, filed on Jul. 28, 2011, which applications are hereby incorporated herein by reference.

FILED OF THE INVENTION

The invention relates to integrated transformers of the balanced-unbalanced type commonly known to those skilled in the art as "balun" transformers. The invention is applicable to, for example, wireless communications such as mobile telephones, or the field of motor vehicle radars.

BACKGROUND OF THE INVENTION

The production of silicon integrated systems, whether they be power or processing systems, is increasingly carried out with differential and variable reference impedance structures for analog portions. External components remain essentially a system of common mode type components with 50Ω reference impedance.

The link between a balanced transmission line and an unbalanced transmission line cannot be produced without an appropriate electrical circuit. This transition is provided by a transformer of the balanced-unbalanced type, also called "balun." A balun converts, for example, a signal of the common mode type into a signal of the differential mode type, and vice versa, and provides impedance transformations. One of the main electrical characteristics of a balun is its insertion loss, which must be as low as possible.

Baluns can also be used, for example, in receiving and transmission circuits of wireless communication systems for the design of differential circuits such as amplifiers, mixers, oscillators and antenna systems. Baluns can be made with transmission lines such as Lange couplers, couplers of the circle-shaped-type commonly known to those skilled in the art as "rat-races", or Marchand couplers or else with stacked or coplanar inductors.

In the transmission and reception circuits of wireless communication systems, the impedance on the differential side may be low, typically of the order of 10 to 20 Ohms for a low-noise amplifier, while the impedance on the common mode side, that is to say on the antenna side, is, as indicated above, usually of the order of 50 Ohms. Thus, there is the need to have a transformation ratio higher than 2, which is particularly complicated to achieve.

Moreover, in transmission, the power amplifier should be supplied with a current of the order of a few hundreds of milliamperes. And, if it is desired to supply the power amplifier via the transformer (balun), there is a resulting impact on the performance of this balun.

SUMMARY OF THE INVENTION

According to one embodiment, a balun architecture is provided that makes it possible to obtain a high transformation ratio while limiting the impact on the performance of the balun, in particular its insertion losses.

According to another embodiment, a balun architecture is provided that makes it possible to power a power amplifier while limiting the impact on the performance of the balun.

According to one aspect, a transformer of the balanced-unbalanced type is provided that includes a primary inductive circuit and a secondary inductive circuit housed inside an additional inductive winding connected in parallel to the terminals of the secondary circuit, and in inductive coupling with the primary circuit and the secondary circuit. Connecting an inductor in parallel on the secondary circuit makes it possible to obtain a transformation ratio higher than 2.

Moreover, housing the primary circuit and the secondary circuit inside the inductive winding (the inductive winding surrounds the primary circuit and the secondary circuit) makes it possible to obtain a strong coupling between the inductive winding and the primary circuit and the secondary circuit, which further helps to increase the transformation ratio. Moreover, the insertion losses are limited relative to an inductor that would be connected in parallel on the secondary circuit but outside this secondary circuit, and, this aspect of the invention also provides an appreciable space savings.

According to another embodiment, permitting especially to power a component, for example a power amplifier, through the transformer while relaxing the constraints of current density in the secondary circuit, the transformer further includes two capacitors respectively connected between the two terminals of the additional inductive winding and the two terminals of the inductive secondary circuit, and the additional inductive winding has a middle point intended to be coupled to a direct voltage source.

The transformer is advantageously made in an integrated manner above a semiconductor substrate.

According to another aspect, a circuit is provided, for example a transmission or reception circuit of a wireless communication device, comprising an antenna, processor and a transformer as defined above, connected between the antenna and the processor.

BRIEF DESCRIPTION OF THE DRAWINGS

Other advantages and features of the invention will appear on examination of the detailed description of non-limiting embodiments, and of the appended drawings in which.

DETAILED DESCRIPTION OF PREFERRED EMBODIMENTS

Figure 1:
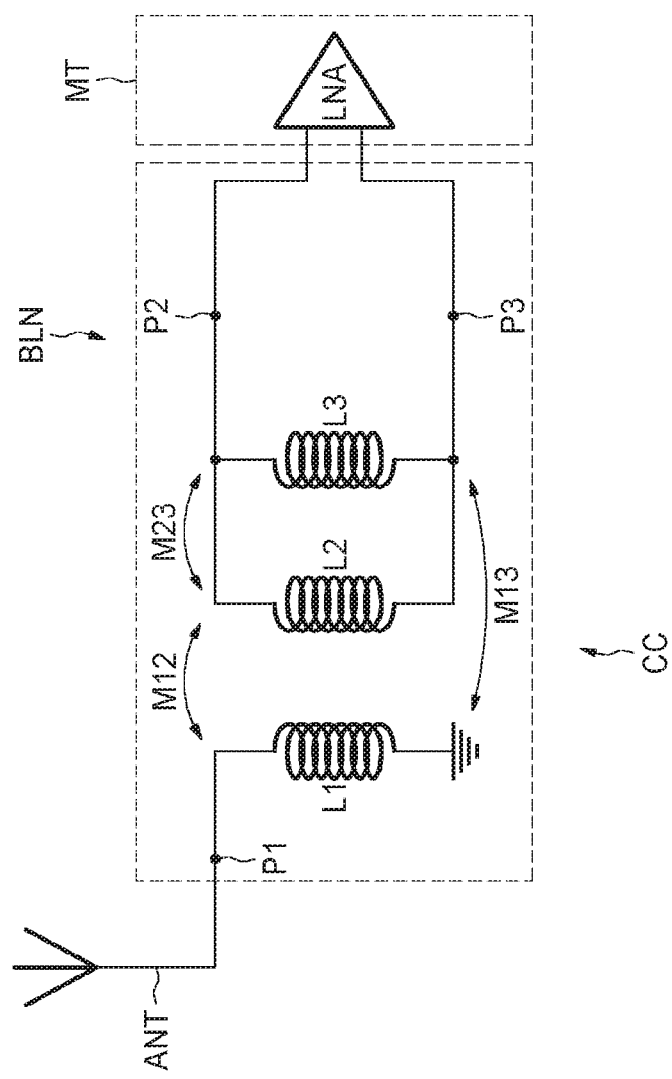
FIG. 1 is a schematic diagram illustrating a wiring diagram of an embodiment of a transformer according to the invention incorporated into an embodiment of a circuit according to the invention.

In FIG. 1, the reference BLN represents a balanced/unbalanced transformer commonly called by those skilled in the art a "balun." This transformer comprises a primary inductive circuit L1 and a secondary inductive circuit L2 mutually in inductive coupling (coefficient M12). The transformer BLN also comprises an inductive winding L3 connected in parallel to the terminals of the secondary circuit L2. The inductive winding L3 is in inductive coupling with the secondary circuit L2 (coefficient M23) and with the primary circuit L1 (coefficient M13).

The two ports P2 and P3 corresponding to the two terminals of the inductive winding L3 form a differential input/output while the port P1, connected to a terminal of the primary circuit L1, forms a single input/output. The other terminal of the primary circuit L1 is usually connected to ground.

When the balun BLN is placed in a circuit CC, for example a reception circuit of a wireless communication device fitted with an antenna ANT, the port P1 is connected to the antenna ANT while the ports P2 and P3 are connected to the differential input of processing means MT, comprising for example in the present case a low-noise amplifier LNA. The transformer BLN therefore makes it possible to carry out an impedance matching between the impedance seen from the port P1 which is usually 50 Ohms, and the input impedance of the amplifier LNA which can be 20 Ohms.

Figure 2A:
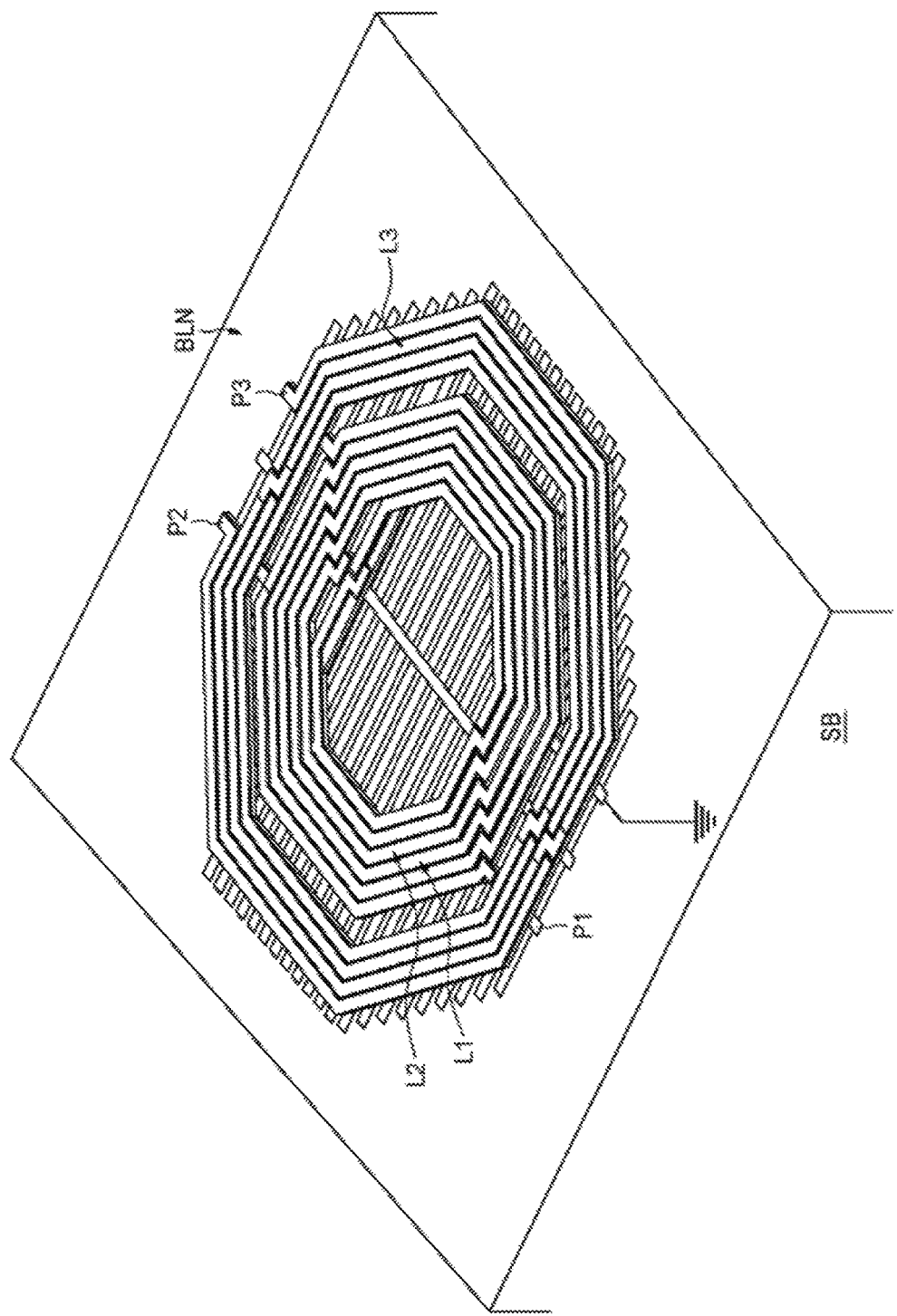
FIG. 2A is a perspective view illustrating in greater detail an embodiment of a transformer according to the invention.

Generally, and as illustrated more particularly in the example of FIG. 2A, the primary circuit L1 and the secondary circuit L2 are housed inside the inductive winding L3. The inductive winding L3 is in this instance a winding that is balanced and coplanar with the circuits L1 and L2. The inductors used for the primary and secondary circuits and for the inductive winding may have different forms, such as rectangular, octagonal or circular inductors and may have a variable number of turns. The inductors may be placed in a coplanar and/or stacked manner.

Figure 2B:
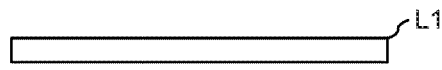
FIGS. 2B, 2C and 2D are cross section views of portions of the embodiment transformer of FIG. 2A according to the invention.
Figure 2B:
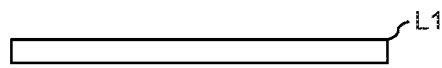
Figure 2C:
Figure 2C:
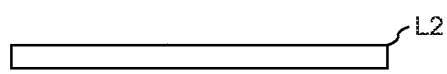
Figure 2D:
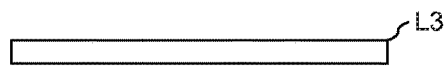
Figure 2D:
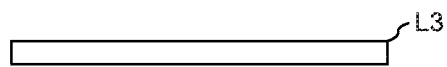

Therefore, in the example of FIG. 2A, the primary and secondary circuits L1 and L2 are circuits made on several metal levels, for example two metal levels, in an interlaced and stacked manner, as shown in FIGS. 2B and 2C. The same applies to the inductor L3, as shown in FIG. 2D.

The transformer is in this instance made in an integrated manner on a semiconductor substrate SB, for example made of silicon. This being so, any type of secondary circuit or primary circuit is suitable. It is possible, for example, to use the primary circuit and the secondary circuit of the transformer of the company STATS ChipPAC Ltd (Singapore) designated by the reference SCI-101 W or SCI-101 F.

Figure 3:
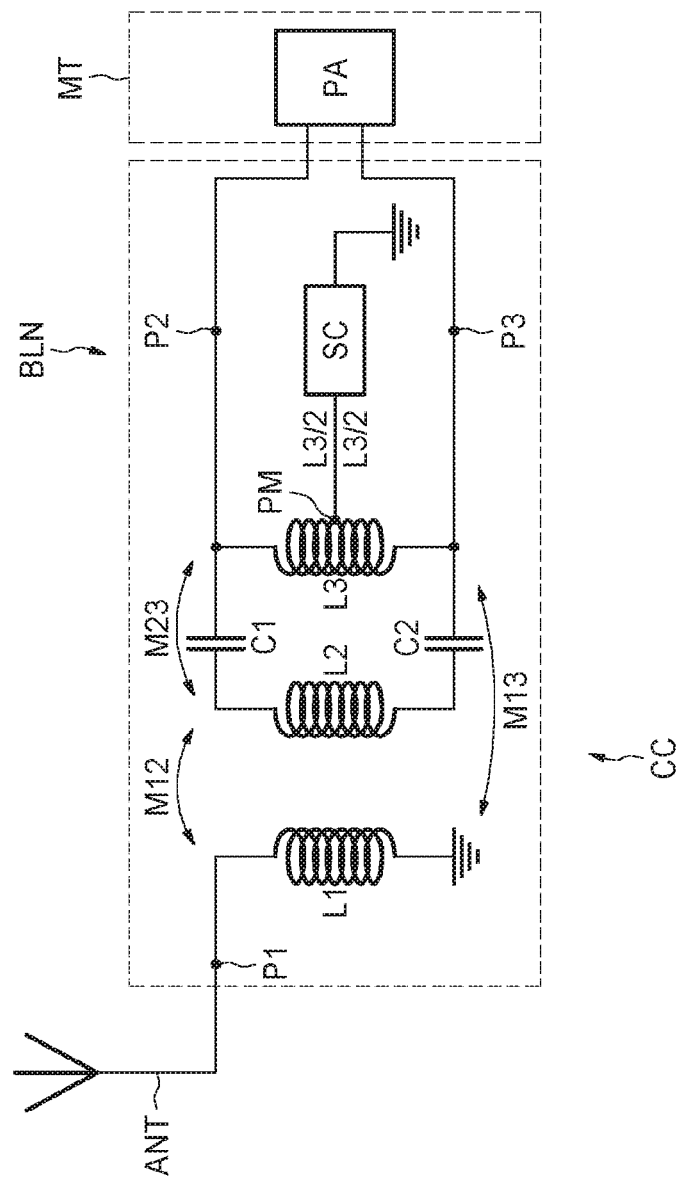
FIG. 3 is a schematic diagram illustrating in greater detail another embodiment of a transformer according to the invention.

Another embodiment of the transformer BLN is illustrated in FIG. 3. With respect to the embodiment of FIG. 1, the transformer BLN comprises two capacitors C1, C2 separating the secondary circuit L2 and the inductive winding L3. Further, the inductive winding L3 has a middle point PM intended to be connected to a direct voltage source SC, to polarize the ports P2 and P3. Of course, again in this embodiment, the primary circuit L1 and the secondary circuit L2 are lodged within the inductive winding L3.

Further to the features which have been described, the capacitance values of the capacitors C1 and C2 are advantageously chosen to be sufficiently high for allowing the passage of a radiofrequency signal from the ports P2 and P3 to the port P1 (those capacitors can be thus considered as being "transparent" in the radiofrequency domain). The acceptable minimal capacitive value of those capacitors decreases when the frequency of the radiofrequency signal decreases.

The skilled artisan will be able to choose the capacitive values of these capacitors as a function of the frequency of the radiofrequency signal, and of trade off between the transmission losses and the area occupied by those capacitors. For example, for a radiofrequency signal having a frequency of 800 MHz, a capacitive value of 60 pf can be chosen for the capacitors C1 and C2. But, taking into account the important area of such a capacitor, an acceptable trade off for this capacitive value is about 30 pf. For a radiofrequency signal having a frequency of 2.5 GHz, C1 and C2 can be chosen at about 20 pf and about 10 pf for a frequency of 5 GHz.

Further, those capacitors permit to isolate the secondary circuit L2 from the polarization direct current. It is thus possible to polarize through the transformer, a component, for example a power amplifier PA of a radiofrequency transmission chain, connected to ports P2 and P3, with a polarization current relatively high, for example around 50 to 100 mA while relaxing the constraints of current density in the secondary circuit L2 (because there is no polarization through the secondary circuit) and by transferring these constraints on the inductive winding L3 which does not require a high quality factor.

This is particularly advantageous because a polarization through the circuit L2 would lead to an increase of the size of the winding L2 and thus its parasitic capacitance, and thus to a decrease of the cut frequency of the transformer, and finally to a decrease of its performance.

Further, the inductive value of the winding L3 is advantageously chosen for reducing as much as possible a passage of the radiofrequency signal in L3 through the polarization source. For example, for a radiofrequency having a frequency of 2.5 GHz, L3 can be chosen about 3 nH and about 1.5 nH for a frequency of 5 GHz.

More generally, the ratio C/L (where C is the capacitive value in pf of the capacitors C1 or C2 and L the inductive value in nH of the winding L3) defines the portion of the radiofrequency signal which passes through the capacitors and the one which passes through the winding L3 to the polarization source. This ratio is advantageously chosen, independently of the frequency of the signal, between 5 and 10, for example equal to 7.

What is claimed is:

1. A transformer comprising:
    a primary winding;
    a secondary winding; and
    an additional winding surrounding the primary winding and the secondary winding, the additional winding being inductively coupled to the primary winding and the secondary winding, wherein the additional winding is coplanar with the primary and secondary winding, and wherein the additional winding is electrically directly connected in parallel with the secondary winding, wherein at least two turns of the additional winding surround a portion of an outermost turn of each of the primary and secondary windings.

2. The transformer of claim 1, wherein the additional winding has an octagonal shape.

3. The transformer of claim 1, wherein the primary winding, secondary winding, and additional winding are disposed over a semiconductor substrate.

4. The transformer of claim 1, wherein the transformer is of the balanced-unbalanced type.

5. The transformer of claim 1, wherein an innermost turn of the additional winding surrounds a portion of an outermost turn of the primary winding or the secondary winding.

6. The transformer of claim 1, wherein at least two turns of the additional winding surround a portion of an outermost turn of each of the primary and secondary windings.

7. A device comprising:
    an antenna;
    a first circuit; and
    a transformer coupled between the antenna and the first circuit, the transformer comprising:
        a primary winding;

a secondary winding inductively coupled to the primary winding, the secondary winding having a first terminal and a second terminal;

an additional winding inductively coupled to the primary and secondary windings, the additional winding having a first terminal and a second terminal;

a first capacitor electrically directly connected between the first terminal of the secondary winding and the first terminal of the additional winding; and a second capacitor electrically directly connected between the second terminal of the secondary winding and the second terminal of the additional winding, wherein at least two turns of the additional winding surround a portion of an outermost turn of each of the primary and secondary windings, and wherein the primary, secondary, and additional windings are formed in a plurality of metal levels.

8. The device of claim 7, wherein the first circuit comprises a low noise amplifier (LNA).

9. The device of claim 7, wherein a portion of the additional winding is symmetric and coplanar with a portion of the primary winding and a portion of the secondary winding.

10. The device of claim 7, wherein:
the antenna is coupled to a first terminal of the primary winding of the transformer; and
a second terminal of the primary winding of the transformer is coupled to ground.

11. The device of claim 7, wherein the first circuit is differentially coupled to the additional winding of the transformer.

12. The device of claim 7, wherein the transformer has a transformation ratio greater than 2.

13. The device of claim 7, wherein the additional winding comprises a tap point configured to receive a polarizing voltage, the polarizing voltage configured to polarize the first circuit without polarizing the secondary winding.

14. The device of claim 13, wherein the tap point is a center-tap point.

15. The device of claim 13, further comprising a direct current voltage source coupled to the tap point and configured to provide the polarizing voltage.

16. The device of claim 15, wherein a portion of a radiofrequency signal that passes through the first and second capacitor and through the additional winding is based on a ratio between a capacitance value of the first capacitor or the second capacitor and an inductance of the additional winding, and wherein the ratio is between 5 and 10.

17. The device of claim 7, wherein the first circuit comprises a power amplifier (PA).

18. A method comprising:
coupling an antenna to a reference terminal via a primary winding of a transformer;
coupling a secondary winding of the transformer to an additional winding of the transformer, the additional winding of the transformer being coplanar with the primary and secondary winding of the transformer and surrounding the primary and secondary winding of the transformer wherein at least two turns of the additional winding surround a portion of an outermost turn of each of the primary and secondary windings;
differentially coupling the additional winding of the transformer to a first circuit; and
polarizing the first circuit without polarizing the secondary winding by:
electrically directly connecting in parallel a first capacitor between a first terminal of the secondary winding and a first terminal of the additional winding;
electrically directly connecting in parallel a second capacitor between a second terminal of the secondary winding and a second terminal of the additional winding; and
providing a voltage to a tap of the additional winding.

19. The method of claim 18, further comprising coupling the reference terminal to ground.

20. The method of claim 18, further comprising receiving a radiofrequency signal with the antenna.

21. The method of claim 18, wherein polarizing the first circuit comprises generating a polarization current higher than 50 mA and providing the polarization current to the first circuit.

* * * * *